US011545976B1

(12) United States Patent
Paterson et al.

(10) Patent No.: US 11,545,976 B1
(45) Date of Patent: Jan. 3, 2023

(54) INTEGRATED CIRCUIT POWER SUPPLY

(71) Applicant: Arm Limited, Cambridge (GB)

(72) Inventors: Richard Andrew Paterson, Thurgoland (GB); Robert John Harrison, Sheffield (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/393,788

(22) Filed: Aug. 4, 2021

(51) Int. Cl.
*H03K 19/00* (2006.01)
*H03K 19/003* (2006.01)
*H03K 19/0175* (2006.01)

(52) U.S. Cl.
CPC ................ *H03K 19/00346* (2013.01); *H03K 19/017581* (2013.01)

(58) Field of Classification Search
None
See application file for complete search history.

(56) References Cited

U.S. PATENT DOCUMENTS 8,365,310 B2 * 1/2013 Shamir .................. H04L 9/003 726/36
9,755,822 B2 * 9/2017 Han ........................ H04L 9/003
10,924,261 B2 * 2/2021 Harrison ................. H04L 9/003
2018/0336372 A1 11/2018 Fleming et al.
2019/0007223 A1 * 1/2019 Vaidya ...................... H04L 9/38

* cited by examiner

*Primary Examiner* — Tuan T Lam
(74) *Attorney, Agent, or Firm* — Nixon & Vanderhye P.C.

(57) ABSTRACT

An integrated circuit comprises a power input, digital logic circuitry, a plurality of charge stores, and obscuring circuitry. The charge stores are configured to receive power from the power input, are distributed through the digital logic circuitry and are capable of providing power to the digital logic circuitry. The obscuring circuitry is configured to obscure electromagnetic emissions associated with flow of current in current loops between the plurality of charge stores and the digital logic circuitry by switching between a plurality of different charge store activation patterns, wherein each charge store activation pattern describes a different selection of one or more of the plurality of charge stores providing power to the digital logic circuitry at a given time.

19 Claims, 13 Drawing Sheets

Switches & 25% hold cap
Hold cap
Switches & 25% hold cap
4
3
1
2
Data path
Loop
5

1
2
3

INTEGRATED CIRCUIT POWER SUPPLY

BACKGROUND

Technical Field

The present technique relates to the field of integrated circuits.

Technical Background

One of the many considerations taken into account when designing secure electronic devices is the vulnerability to side channel attacks. Side channel attacks aim to determine information about a system by analysing indirect consequences of program execution, rather than targeting the code or its data directly. A power analysis attack is an example of a side channel attack that involves studying the power consumption of the system. For example, the current on the power supply could be measured to provide information about the system.

An electromagnetic (EM) attack is another example of a side channel attack that involves monitoring the electromagnetic fields in the vicinity of a device while it is performing processing. EM attacks may be able to determine information about a system's operation.

SUMMARY

Viewed from aspect, the present technique provides an integrated circuit comprising:

a power input;

digital logic circuitry;

a plurality of charge stores, configured to receive power from the power input, distributed through the digital logic circuitry and capable of providing power to the digital logic circuitry; and obscuring circuitry configured to obscure electromagnetic emissions associated with flow of current in current loops between the plurality of charge stores and the digital logic circuitry by switching between a plurality of different charge store activation patterns, wherein:

each charge store activation pattern describes a different selection of one or more of the plurality of charge stores providing power to the digital logic circuitry at a given time.

Viewed from another aspect, the present technique provides a method for an integrated circuit, comprising:

- charging, using a power input, a plurality of charge stores distributed through digital logic circuitry and capable of providing power to the digital logic circuitry; and
- obscuring electromagnetic emissions associated with the flow of current in current loops between the plurality of charge stores and the digital logic circuitry by switching between a plurality of different charge store activation patterns, wherein:
- each charge store activation pattern describes a different selection of one or more of the plurality of charge stores providing power to the digital logic circuitry at a given time.

Further aspects, features and advantages of the present technique will be apparent from the following description of examples, which is to be read in conjunction with the accompanying drawings.

DESCRIPTION OF EXAMPLES

Figure 1:
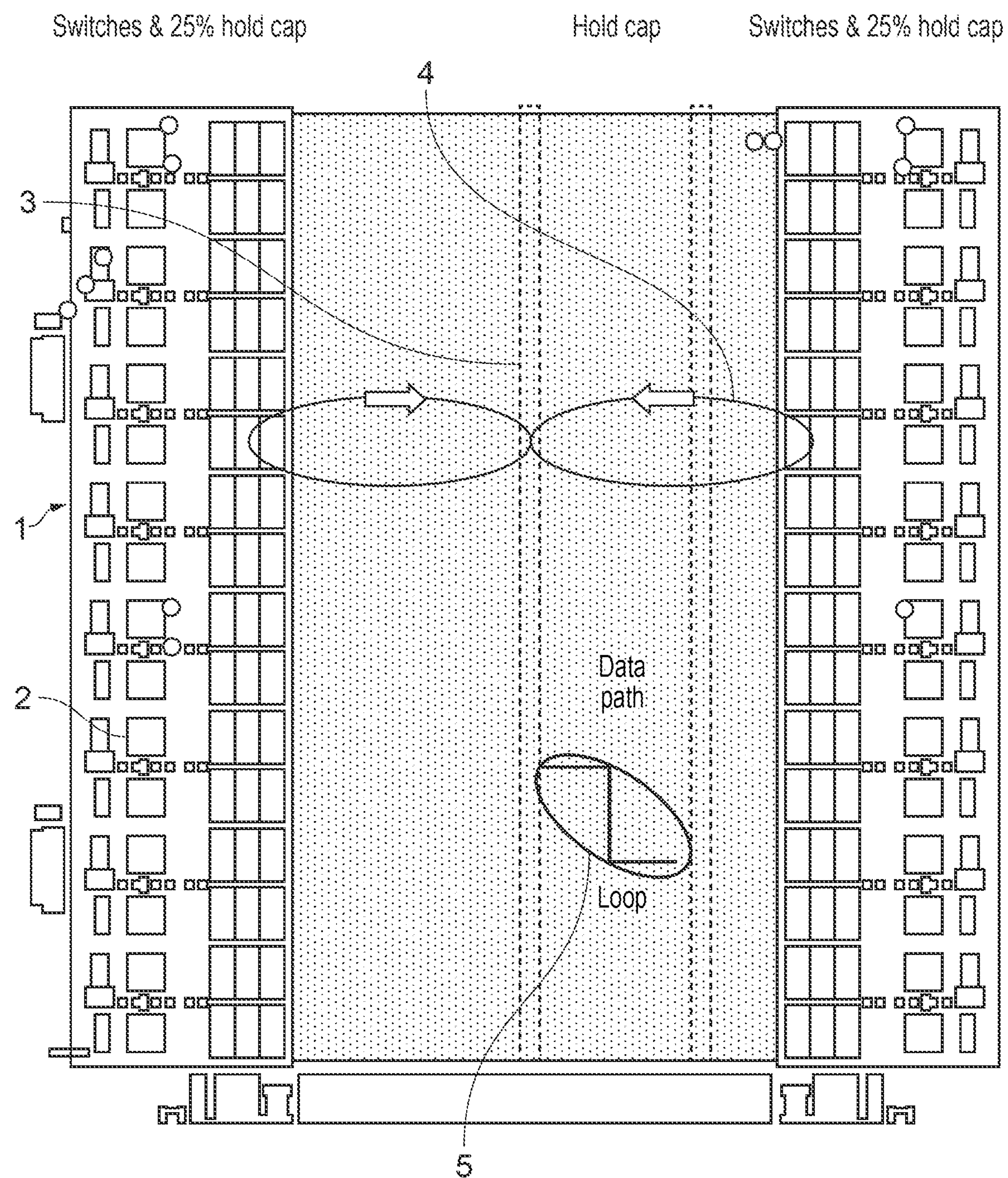
FIG. 1 illustrates a schematic diagram of an integrated circuit with an isolated power supply.

An integrated circuit comprises digital logic circuitry. Digital logic circuitry may comprise basic components such as transistors or flip-flops, or more complex structures formed by combinations of components. Digital logic circuitry carries out digital processing within the integrated circuit. In one example, the integrated circuit is a cryptographic unit, and the digital logic circuitry carries out cryptographic operations.

The integrated circuit comprises a power input, from which power is received to power the digital logic circuitry. The integrated circuit also comprises a plurality of charge stores, which can receive and store power to deliver at a later time. For example, a charge store may be a capacitor. The charge stores are configured to receive power from the power input and are capable of providing power to the digital logic circuitry. For example, the charge stores may be electrically connected to the power input and the digital logic circuitry. The charge stores can provide protection against power analysis side channel attacks, such as differential power analysis (DPA) attacks. A DPA attack may monitor the current on the power input, which (in systems not providing the charge stores between the power input and the digital logic circuitry) may typically be related to the activity of the digital logic circuitry, and can involve performing statistical analysis on the measured values to extract information from the digital logic circuitry. For example, if the integrated circuit is a cryptographic unit, a DPA attack may be able to extract secret keys by measuring current over a number of cryptographic operations. By isolating the power input from the digital logic circuitry through use of charge stores, it can be much harder to extract useful information from the current on the power input in a DPA attack. However, the system may still be vulnerable to electromagnetic (EM) side channel attacks.

EM attacks monitor the electromagnetic fields in the vicinity of a device to extract information about the device. For example, when a charge store provides power to digital logic circuitry, a current loop may be formed between the charge store and the digital logic circuitry. The current loop will generate a magnetic field in the vicinity of the current loop. An EM attack may employ an EM probe, which may be inserted into the device and can be designed such that the magnetic field generated by the current loop induces a current in the EM probe. Measurement of the current in the EM probe can therefore provide information about the current loop between the charge store and the digital logic circuitry. In this way, an EM attack may be used to extract information from an integrated circuit. It will be appreciated that this is provided as an example, and other EM attacks can also extract information from the electromagnetic fields emitted from an integrated circuit.

In an integrated circuit according to the present technique, charge stores are distributed through the digital logic circuitry. At least some digital logic circuitry in the integrated circuit is configured to receive power from more than one charge store. The integrated circuit comprises obscuring circuitry to obscure electromagnetic emissions associated with flow of current in current loops between the plurality of charge stores and the digital logic circuitry by switching between a plurality of different charge store activation patterns. Each charge store activation pattern describes a different selection of one or more of the plurality of charge stores providing power to the digital logic circuitry at a given time. Therefore, by switching between different charge store activation patterns, the power provided to digital logic circuitry at a given time is provided by charge stores that may be different to the charge stores providing power to the digital logic circuitry at a different time. In this way, the current loops between charge stores and digital logic circuitry will change when there is a different charge store activation pattern. This can make it more difficult to extract information from the electromagnetic emissions from the integrated circuit.

The obscuring circuitry may be configured to switch between the plurality of different charge store activation patterns according to a sequence. In some examples, the sequence may be random. Therefore, the selection of charge stores in each charge store activation pattern in the sequence may follow no predetermined sequence. This could be achieved using a number of techniques, such as using a random number generator to select which charge stores to include in a charge store activation pattern. If the charge store activation pattern changes according to a random sequence, it can be very hard to predict a future charge store activation pattern, and therefore it can be very difficult to account for the effect of the obscuring circuitry when performing an EM attack. However, the obscuring circuitry may alternatively switch between the plurality of different charge store activation patterns according to a predetermined sequence. A random sequence may have greater unpredictability, but a predetermined sequence can be simpler to implement. Both techniques may change the EM fields around the integrated circuit in a way unrelated to the activity of the digital logic circuitry, and therefore either of a random sequence or a predetermined sequence can provide improved security against side channel attacks.

The obscuring circuitry is configured to switch between the plurality of different charge store activation patterns according to the predetermined or random sequence starting at a start-point charge store activation pattern. A new sequence may start when a new operation is carried out in the integrated circuit, or at certain time intervals, or after resetting the digital logic circuitry, for example. In some examples, the start-point charge store activation pattern may be the same each time. This may provide a simpler implementation of the present technique. However, the obscuring circuitry may be configured to select the start-point charge store activation pattern each time the predetermined or random sequence starts. The start-point charge store activation pattern may be selected according to a predetermined sequence, or the start-point charge store activation pattern may be selected randomly or pseudorandomly. For example, a random number generator may be used to select a start-point charge store activation pattern each time the start-point charge store activation pattern is selected. Alternatively, a linear-feedback shift register (LFSR) may be used to pseudorandomly select a start-point charge store activation pattern. By randomly or pseudorandomly selecting the start-point charge store activation pattern, it can be harder to predict which charge store activation pattern will be selected at a given time, and the security of the system against EM attacks can be improved.

As discussed above, the obscuring circuitry may switch between the plurality of different charge store activation patterns according to a predetermined sequence. The predetermined sequence could be such that charge store activation patterns are chosen according to predictable order. Alternatively, the predetermined sequence may be arranged in a pseudorandom order, which may simulate the effect of a random sequence without incurring the cost of a random number generator. This could be achieved, for example, by use of a shift register as further discussed below.

The predetermined sequence may be chosen to allow neighbouring charge store activation patterns to be the same as each other, where a charge store activation pattern that is a neighbouring charge store activation pattern to a given charge store activation pattern in the predetermined sequence is a charge store activation pattern that immediately precedes or follows the given charge store activation pattern in the sequence. However, it may be desirable that the charge store activation pattern changes each time the obscuring circuitry switches between the plurality of charge store activation patterns in order to improve the resistance of the system to EM attacks. Therefore, the predetermined sequence may be chosen such that neighbouring charge store activation patterns are different to each other. If the sequence is a random sequence instead of a predetermined sequence, the next charge store activation pattern in the random sequence may be chosen such that it is not the same as the previously selected charge store activation pattern (the currently active pattern). This could be implemented by excluding the previously selected charge store activation pattern from the set of charge store activation patterns from which the random selection will be made. Alternatively, a simpler implementation may be to randomly select a next charge store activation pattern from the set of all charge store activation patterns, and discard the selection if it is equal to the previously selected charge store activation pattern. Either technique will allow the obscuring circuitry to change the charge store activation pattern each time it switches between charge store activation patterns.

The obscuring circuitry may comprise a shift register, wherein each charge store activation pattern is associated with a state of the shift register. Therefore, by shifting the shift register, a new charge store activation pattern can be selected. Shift registers are deterministic, so shifting the shift register by a predetermined amount at each transition will allow the obscuring circuitry to switch between the plurality of different charge store activation patterns according to a predetermined sequence. A shift register could also be used to switch between charge store activation patterns according to a random sequence, where a next charge store activation pattern is selected by shifting the shift register by a random amount (that is, advancing the state of the shift register by a randomly selected number of state transitions). A particular type of shift register is a linear-feedback shift register (LFSR). The input bit of an LFSR depends on a linear combination of the previous state of the LFSR, which allows an LFSR to have states that, while deterministic, repeat after a certain number of updates and can appear random. Therefore, these can provide a particularly effective mechanism by which to implement a predetermined sequence arranged in a pseudorandom order.

The charge stores may be any component capable of receiving power from the power input, storing the energy, and then providing the power to digital logic circuitry. In some examples, at least one charge store in the plurality of charge stores is a capacitor.

In some examples, any number of charge stores may be included in each charge store activation pattern. However, there may be a requirement for a minimum amount of power to be provided to the digital logic circuitry, or it may be desired that a certain amount of power is provided to the digital logic circuitry even if it is not necessary for the operation of the digital logic circuitry. As such, each charge store activation pattern may describe a selection of one or more charge stores with a combined charge capacity greater than a threshold amount. That is, if the charge capacities of each charge store in the selection were added together, this combined charge capacity would exceed the threshold amount. If each charge store holds the same amount of charge, then this may be achieved by requiring that each charge store activation pattern includes at least N charge stores. This requirement does not place a restriction on the maximum combined charge capacity of the charge stores, and as such a selection of charge stores with the same amount of charge may include more than N charge stores. There is also no requirement for every charge store activation pattern to describe a selection of charge stores with the same combined charge capacity, as long as it equals or exceeds the threshold amount.

In some examples, the threshold amount may be a fixed parameter of the system. However, in some examples the threshold amount may be a configurable parameter of the system. For example, the threshold amount may be determined based on a value in a register, and a new value may be written to a register to update the threshold amount. This may be helpful if the power requirements of the digital logic circuitry change. It can also provide a mechanism to further obscure the EM emissions from the system, as varying the minimum combined charge capacity of the selection of charge stores can affect the selection of charge stores in each charge store activation pattern, which will affect the current loops between the charge stores and the digital logic circuitry. By supporting different thresholds, this means that when lower power is needed there can be more options for combinations of varying numbers/capacities of charge store that would meet the power demand, so that the cycle of charge store activation patterns may cycle through a greater number of states to further obscure EM emissions (in contrast, if only one power level was supported with sufficient combined charge capacity to meet peak power demands, this would limit the number of combinations of charge store activations that could meet that power demand, even when the peak power demand is not required).

The obscuring circuitry can switch between the plurality of different charge store activation patterns in different ways. In one embodiment, the obscuring circuitry is configured to switch between charge store activation patterns by controlling the charging of charge stores. That is, a charge store activation pattern can be set by charging only the charge stores that are to be included in the selection of charge stores of the particular charge store activation pattern. For example, switches could be provided between the power input and the charge stores, controlled by the obscuring circuitry to control charging of the charge stores. In this case, when the charge stores are powering the digital logic circuitry, each of the charge stores can be connected to the digital logic circuitry (including those not in the selection), but power will only flow from the charge stores that have been charged. Therefore, current loops are formed only between the digital logic circuitry and the charge stores that were selectively charged from the power input.

In another embodiment, the obscuring circuitry is configured to switch between charge store activation patterns by controlling the discharging of the charge stores to the digital logic circuitry. All charge stores may, for example, be charged from the power input (including those not in the selection). A charge store activation pattern can then be set by controlling which charge stores provide power to the digital logic circuitry. For example, switches could be provided between the charge stores and the digital logic circuitry, controlled by the obscuring circuitry to control discharging of the charge stores. Therefore, current loops are formed only between the digital logic circuitry and the charge stores that are selectively discharged to the digital logic circuitry.

It will be appreciated that the two techniques described above, controlling the charge store activation patterns by selectively charging or selectively discharging the charge stores, are not mutually exclusive, and both techniques could be used together.

Employing the present techniques can increase the resistance of a system to EM side channel attacks. When an EM probe is held in a fixed position relative to the integrated circuit, the current induced in the probe by a current loop will be related to the orientation and position of the probe. The current loops formed between the digital logic circuitry and the different charge stores are localised in different positions, and have different orientations. They can also vary in strength, for example if a fixed amount of power is delivered using a different number of current loops. As such, an EM probe held at a fixed position relative to the integrated circuit may detect different readings (different amounts of current induced in the EM probe) for different charge store activation patterns, even if the charge stores are delivering the same amount of power to the digital logic circuitry. In this way, variations in EM emissions that might typically be related to the activity of the digital logic circuitry can be obscured by the variations caused by switching between different charge store activation patterns.

The frequency with which the obscuring circuitry switches between different charge store activation patterns is not particularly limited.

In some examples, switching frequency may be determined on the basis of charging cycles of the charge stores. In the described system, charge stores are charged by the power input and discharged to the digital logic circuitry. Therefore, the charge stores operate in charging cycles. The obscuring circuitry may switch between different charge store activation patterns based on these charging cycles. In a simple example, the charge store activation pattern may switch for every charging cycle, for example a new selection of one or more of the plurality of charge stores could be made every time the charge stores are charged. Alternatively, the charge store activation pattern may switch every M charging cycles, where M is a positive integer greater than one, or may change within a charging cycle. The charge store activation pattern may even switch based on charging cycles in a more complex manner such as every X charging cycles, where X is a value that changes over time.

Alternatively, or as well, the obscuring circuitry may switch between charge store activation patterns at intervals determined based on time. For example, a clock signal could control when the charge store activation pattern is to be switched, e.g. after a certain number of clock cycles.

Alternatively, or as well, the obscuring circuitry may switch between charge store activation patterns at intervals based on the start or completion of processing operations carried out by the digital logic circuitry. For example, when the digital logic circuitry is cryptographic circuitry performing a cryptographic operation comprising several arithmetic operations, the obscuring circuitry may switch between charge store activation patterns at the start of each arithmetic operation instead of, or in addition to, switching based on charging cycles and/or time.

The obscuring circuitry may be capable of switching between charge store activation patterns at a timing independent of the control of software. For example, if the integrated circuit is part of a larger processing system executing software, the obscuring circuitry may be configured to switch between charge store activation patterns at a switching timing that is outside of the control of the software. In addition, the obscuring circuitry may be capable of switching between charge store activation patterns at a switching timing outside of the control of power control circuitry for controlling the amount of power provided to the digital logic circuitry. Hence, for a given power setting configured by software or the power control circuitry, the charge store activation patterns may still change from time to time even if there has been no change in the high-level power demands imposed by the software or the power control circuitry. This enables the dependence of EM emissions on processing activity of the digital circuit logic to be obscured.

The plurality of different charge store activation patterns may include two or more charge store activation patterns that include the same number of charge stores. Alternatively, the plurality of different charge store activation patterns may include two or more charge store activation patterns that have the same combined charge capacity. Therefore, switching between charge store activation patterns may not change the amount of power provided to the digital logic circuitry, but can still increase the resistance of the system to an EM attack.

The plurality of charge stores may be distributed through the digital logic circuitry in any manner. For example, the charge stores may be randomly distributed through the digital logic circuitry. However, in one embodiment the charge stores are distributed through the digital logic circuitry in a tiled arrangement where the charge stores are arranged in regular rows and columns. This can provide a particularly effective arrangement for making efficient connections between components. A tiled arrangement can also mean that a given region of digital logic circuitry is well-surrounded by charge stores, such that the current loops formed between digital logic circuitry and the charge stores are well distributed, are shorter, and have a range of orientations.

The plurality of charge stores may be divided into groups. For example, there may be a plurality of sub-groups of charge stores. In one example, each sub-group of charge stores provides power to a separate region of digital logic circuitry. The obscuring circuitry may control the switching of charge store activation patterns in the same way for each sub-group. However, to provide further protection against EM attacks, obscuring circuitry may control switching between charge store activation patterns separately for each sub-group.

The obscuring circuitry may switch between charge store activation patterns for different sub-groups according to different predetermined or random sequences. The obscuring circuitry may switch between charge store activation patterns at different times for different sub-groups. The obscuring circuitry may also switch between charge store activation patterns starting at different start-point charge store activation patterns for different sub-groups. The obscuring circuitry may use any combination of these features to switch between charge store activation patterns for different sub-groups.

FIG. 1 illustrates a schematic diagram of an integrated circuit with an isolated power supply. The integrated circuit 1 comprises capacitors 2 in capacitor banks at the edges of the integrated circuit 1. The integrated circuit 1 also comprises digital logic circuitry 3. Power is supplied to the capacitors 2 from an external power supply, and then provided from the capacitors 2 to the digital logic circuitry 3. In this example, power may be provided to a given region of digital logic circuitry 3 from a single one of the capacitors 2. In this way, the power supply is isolated from the digital logic circuitry 3. This can provide protection against power analysis side channel attacks, such as differential power analysis (DPA) attacks. A DPA attack may monitor the current on the power input, which (if the capacitors 2 had not been provided) may typically be related to the activity of the digital logic circuitry 3, and can perform statistical analysis on the measured values to extract information from the digital logic circuitry 3. For example, if the integrated circuit 1 is a cryptographic unit, a DPA attack may be able to extract secret keys by measuring current over a number of cryptographic operations. By isolating the power input from the digital logic circuitry 3 through use of capacitors, it can be much harder to extract useful information from the current on the power input in a DPA attack.

EM attacks monitor the electromagnetic emissions from a device to extract information about the device. For example, when a capacitor 2 provides power to digital logic circuitry 3, a current loop 4 may be formed between the charge store and the digital logic circuitry. The current loop 4 will generate a magnetic field in the vicinity of the current loop 4. An EM attack may employ an EM probe, which may be held near the device and can be designed such that the magnetic field generated by the current loop induces a current in the EM probe. Measurement of the current in the EM probe can therefore provide an indication of the current in the current loop 4 between the capacitor 2 and the digital logic circuitry 3. In this way, an EM attack may be used to extract information from an integrated circuit 1. The integrated circuit 1 shown in FIG. 1 has capacitor banks at the edges of the integrated circuit 1, meaning that current loops 4 formed between the capacitors 2 and the digital logic circuitry 3 may be relatively long. This makes such a design more susceptible to EM attacks. Also, in the integrated circuit shown in FIG. 1, there may also be current loops 5 formed between different regions of the digital logic circuitry 3. For example, data may be transferred from one flip-flop to another, causing a current loop 5. The current loop 5 may also be susceptible to EM attacks.

Figure 2:
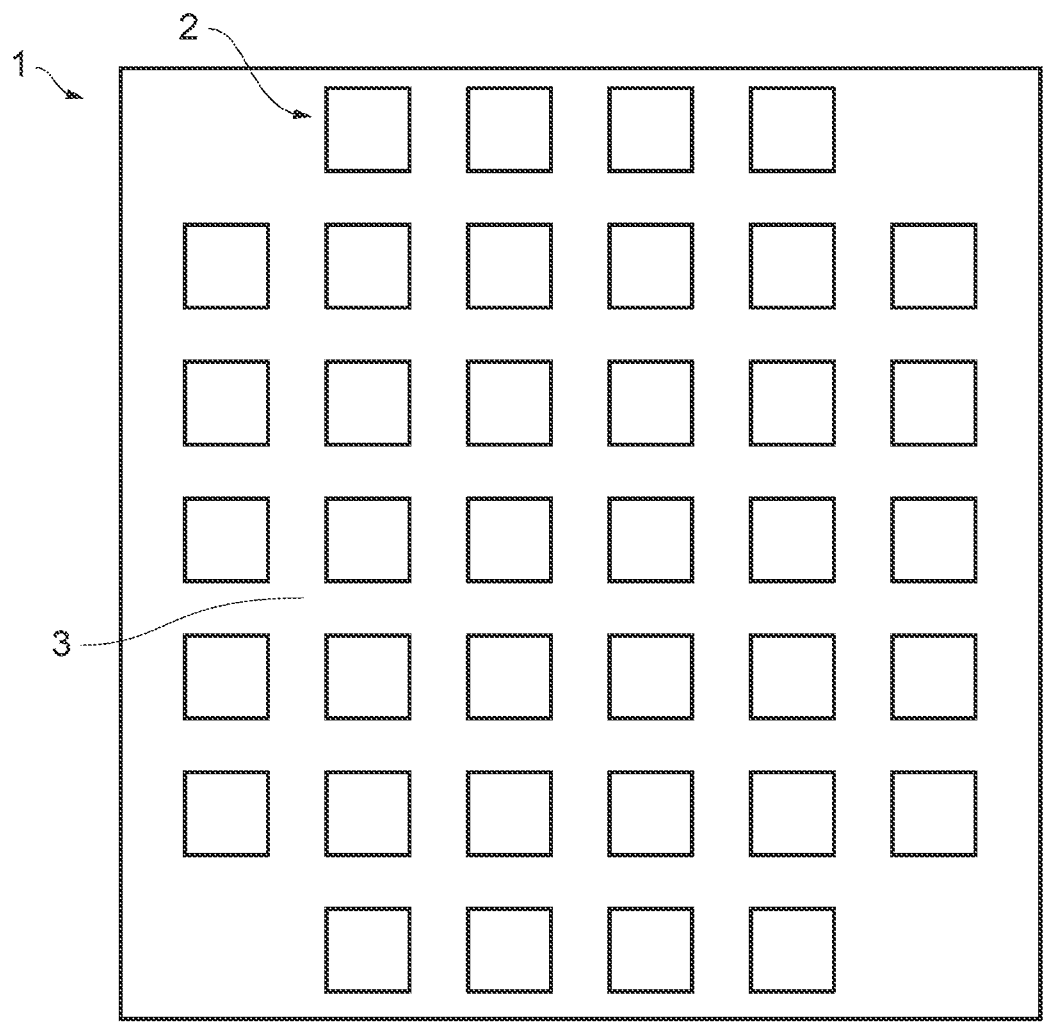
FIG. 2 illustrates a schematic diagram of a tiled capacitor design for an integrated circuit.

FIG. 2 illustrates a schematic diagram of a tiled capacitor design for an integrated circuit 1. Compared to the integrated circuit 1 shown in FIG. 1, the capacitors 2 of FIG. 2 are distributed through the integrated circuit 1 in a tiled arrangement. In this example, power for a given region of the digital logic circuitry may still be provided by only a single capacitor 2. However, by distributing the capacitors 2 through the integrated circuit 1, and thereby through the digital logic circuitry 3, the current loops 4 between capacitors 2 and digital logic circuitry 3 have been changed. In particular, the integrated circuit 1 of FIG. 2 has shorter current loops 4, and current loops 4 with a greater range of orientations, than the integrated circuit 1 of FIG. 1. This may make the integrated circuit 1 of FIG. 2 more resistant to EM attacks.

However, the current loops 4 of the integrated circuits 1 of both FIGS. 1 and 2 are constant in both direction and size as power for a given region of digital logic circuitry 3 is consistently provided by the same capacitor(s) 2. Therefore, a well-designed EM attack may still be able to extract information from these systems.

Figure 3:
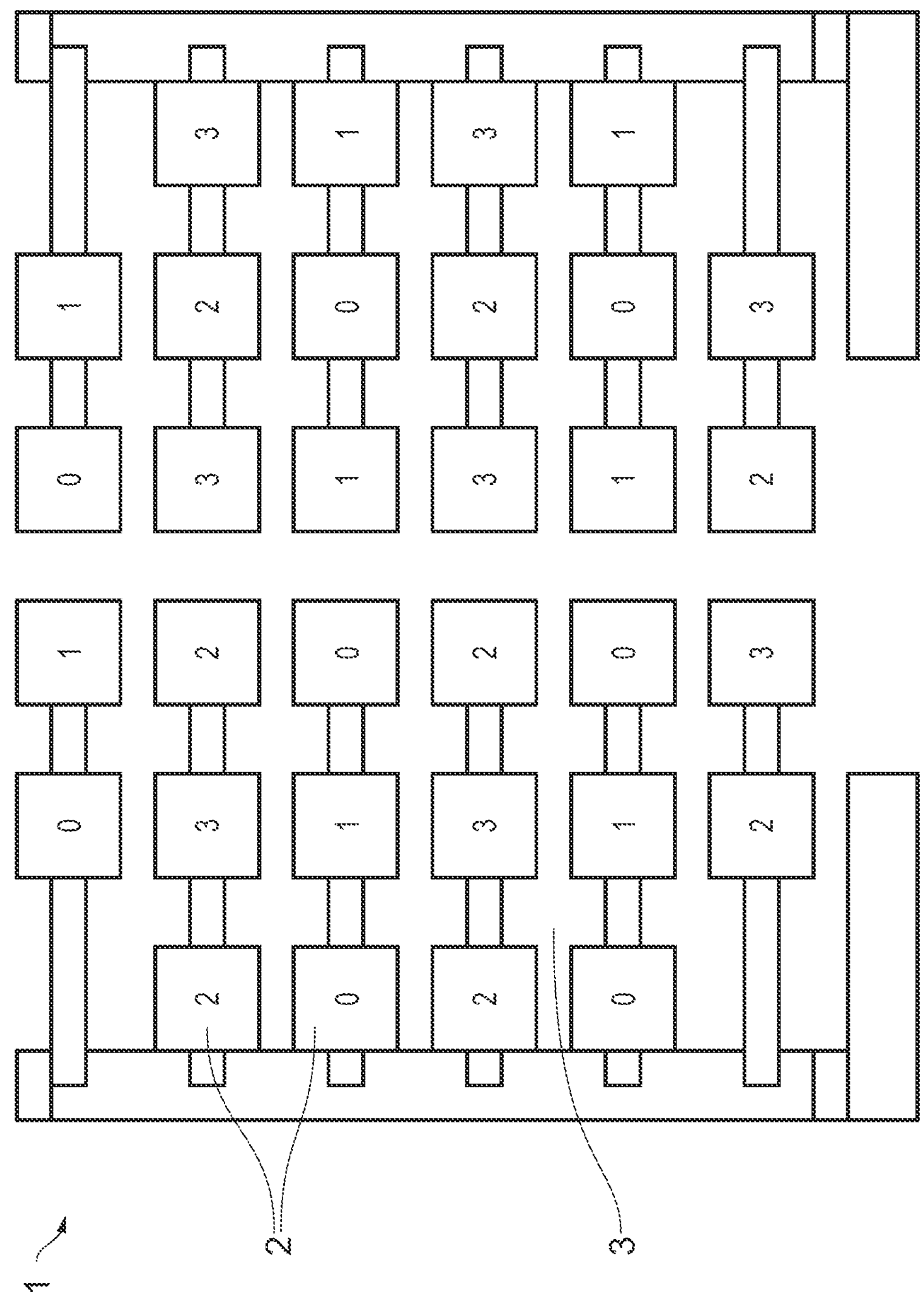
FIG. 3 illustrates a schematic diagram of a tiled capacitor design for an integrated circuit.

FIG. 3 also illustrates a schematic diagram of a tiled capacitor design for an integrated circuit 1. In this example, the capacitors 2 have been labelled "0", "1", "2", and "3" for ease of illustration. It should be noted than in the discussion of all Figures, the term "capacitors" will be used for simplicity. However, it will be appreciated that the embodiments are not limited to "capacitors", and the role of the capacitors 2 can be carried out by other charge stores. Digital logic circuitry 3 may be distributed through the integrated circuit 1. FIG. 3 is used to illustrate an embodiment of the present technique. The integrated circuit 1 of FIG. 3 additionally comprises obscuring circuitry (not shown in this Figure). The obscuring circuitry acts to control the powering of digital logic circuitry 3 from the capacitors 2. The obscuring circuitry switches between different charge store activation patterns, where each charge store activation pattern describes a selection of one or more capacitors 2 providing power to the digital logic circuitry 3 at a given time. By switching between different charge store activation patterns, the current loops formed between the capacitors 2 and the digital logic circuitry 3 will vary, as will be discussed in more detail later, and it can become harder to perform an EM attack.

In general, there may be a minimum amount of power that the capacitors 2 need to provide to the digital logic circuitry 3 for proper function of the integrated circuit 1. However, there is no need to restrict the number of capacitors 2 simultaneously providing power to the digital logic circuitry 3 to this minimum amount of power. The system can be designed such that more capacitors 2 are provided than are needed to provide power at any given time. For example, although it may be sufficient to supply digital logic circuitry 3 with power from two capacitors 2, there is no reason that the present technique cannot include charge store activation patterns where more than two capacitors 2 are used. If a given amount of power is supplied from three (for example) capacitors 2 instead of two, the amount of power in each current loop 4 will be reduced. Therefore, switching between charge store activation patterns can not only change the location and orientation of current loops, but can also change their size. This further obfuscates the information directly related to the activity of the digital logic circuitry.

Figure 4:
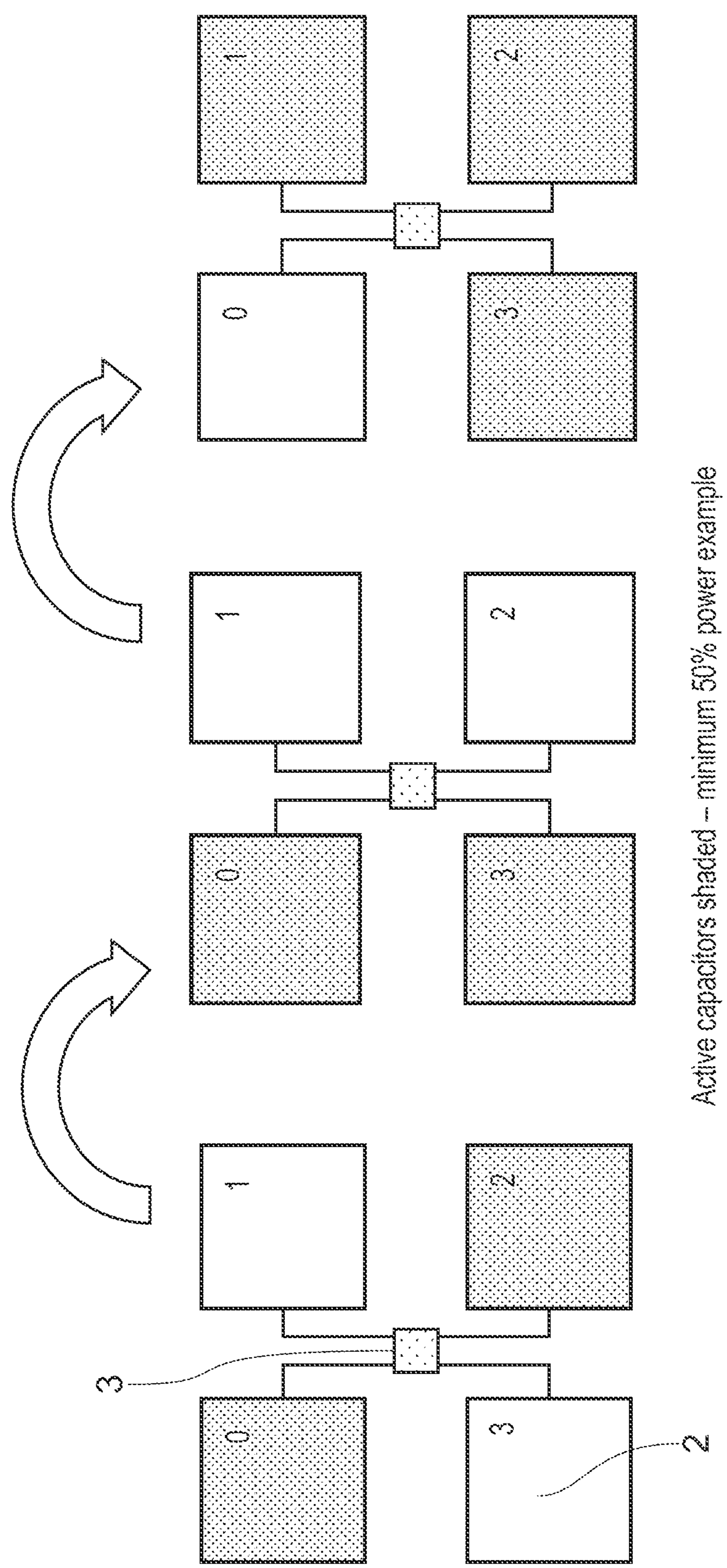
FIG. 4 illustrates a schematic diagram of a sequence of charge store activation patterns.

FIG. 4 illustrates a schematic diagram of a sequence of charge store activation patterns. This can be seen to be a zoomed-in view of a particular region of the integrated circuit 1 of FIG. 3. Digital logic circuitry 3 can receive power from four capacitors 2 (labelled "0"-"4"). In FIG. 4 this is shown by electrically conductive paths linking the capacitors 2 and the digital logic circuitry 3. Note that this diagram is schematic, and there is no meaning assigned to which side of the digital logic circuitry 3 the capacitors 2 connect. FIG. 4 assumes a 50% charge rate, meaning that at any time a minimum of 50% of the available capacitors 2 should be active to meet the minimum power setting.

The leftmost part of FIG. 4 illustrates one charge store activation pattern. In this example, capacitors "0" and "2" are providing power to the digital logic circuitry 3. If this were the only charge store activation pattern used, the current loops 4 between the capacitors 2 and the digital logic circuitry 3 would be stationary. The current loops 4 would only display variations in magnitude related to the activity of the digital logic circuitry 3. This means that an attacker could use an EM probe to monitor the integrated circuit 1 and extract information about the digital logic circuitry 3, such as secret keys if the digital logic circuitry 3 is performing cryptographic operations. However, according to the present technique, the obscuring circuitry switches the charge store activation patterns. For example, the charge store activation pattern could be switched as indicated to the central pattern, in which capacitors "0" and "3" are providing power to the digital logic circuitry 3. The charge store activation pattern could then be switched to the rightmost charge store activation pattern in which capacitors "1", "2", and "3" are providing power to the digital logic circuitry 3. By switching the charge store activation patterns, the current loops 4 between the capacitors 2 and the digital logic circuitry 3 move to different locations, change orientations, and can change in size. These changes cause variations in the values detected by an EM probe unrelated to the activity of the digital logic circuitry 3, and can make it much harder for an EM attack to extract useful information about the system.

Note that the rightmost charge store activation pattern has three active capacitors (75% of the total) whereas the leftmost and central charge store activation patterns have two active capacitors (50%). This variation in the number of capacitors 2 in each charge store activation pattern can be allowed by provisioning more capacitors 2 than are necessary to provide power to the system at a given time.

Figure 5:
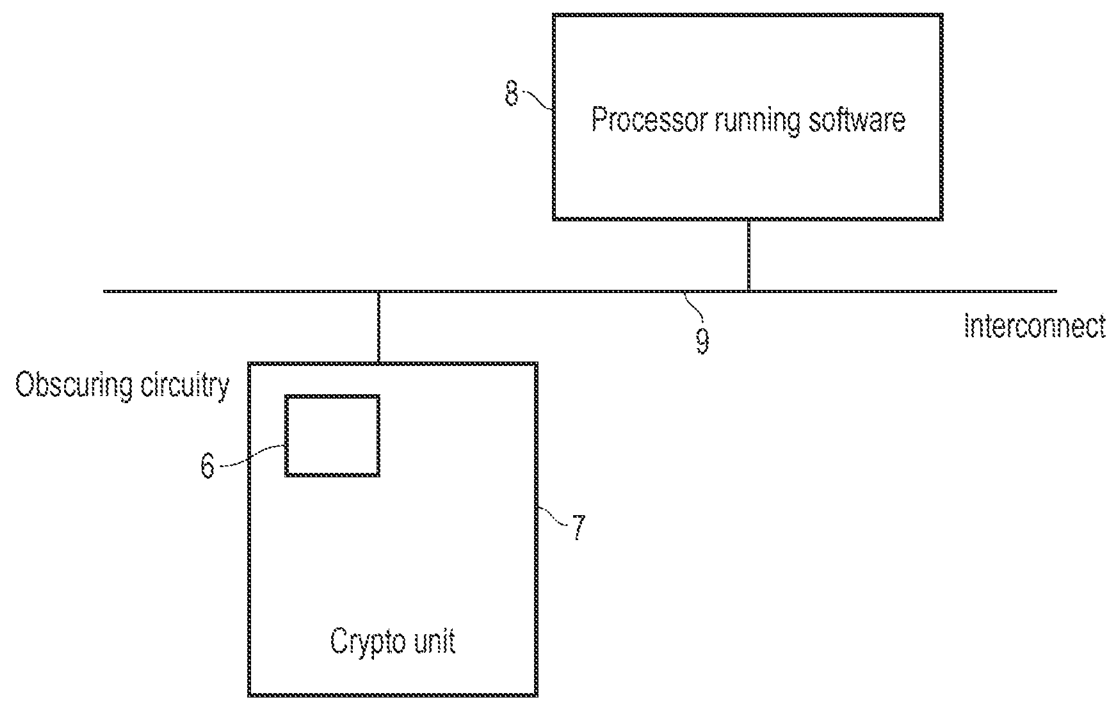
FIG. 5 illustrates a schematic diagram of a processing system including a cryptographic unit.

FIG. 5 illustrates a schematic diagram of a processing system including a cryptographic unit 7. A cryptographic unit 7 is an example of an integrated circuit 1 that may have particular security requirements, and may be targeted by side channel attacks. A cryptographic unit 7 may be part of a larger system. For example, a cryptographic unit 7 may be part of a processing system comprising a processor 8, to which the cryptographic unit 7 is connected via an interconnect 9. Further components may also be connected to the interconnect 9, such as additional processors, I/O devices, and memory. The cryptographic unit 7 may decrypt encrypted data in response to requests over the interconnect 9 by the processor 8, by performing cryptographic operations using secret keys without revealing the secret keys themselves on the interconnect 9. An attacker may, for example, wish to obtain a secret key from the cryptographic unit 7, and may employ a side channel attack to do so.

FIG. 5 illustrates obscuring circuitry 6 located within the cryptographic unit 7. As described earlier, each charge store activation pattern may describe a selection of one or more capacitors 2 with a combined charge capacity greater than a threshold amount. If each capacitor 2 holds the same amount of charge, then this may be achieved by requiring that each charge store activation pattern includes at least N capacitors 2. In some examples the threshold amount may be a configurable parameter of the system. For example, the threshold amount could be stored as a power setting value in a register within the obscuring circuitry. In order to change the value of the power setting, the processor 8 may execute a power setting update instruction, writing a value over the interconnect 9 to an accessible register in the cryptographic unit 7. However, the obscuring circuitry 6 may control switching between charge store activation patterns at a timing independent of the control of software executing on the processor 8. For example, the register updated by the processor 8 in response to the power setting update instruction may be considered as a request to the obscuring circuitry 6, which may then choose to update the power setting (and do so at a time of its own choosing) or may not update the power setting. Therefore, if the processor 8 has been compromised, it is less likely to be used to control the obscuring circuitry 6 in a way that could make the cryptographic unit 7 more susceptible to side channel attacks.

The obscuring circuitry 6 is capable of switching between charge store activation patterns regardless of whether software operating on the processor 8 has requested a change of charge store activation pattern. The obscuring circuitry 6 can still change between charge store activation patterns if it receives no input from the processor 8. The intervals at which the obscuring circuitry 6 switches between different charge store activation patterns are not particularly limited. For example, the intervals may be determined on the basis of charging cycles of the capacitors 2. In the system of FIG. 4, capacitors 2 are charged by the power input and discharged to the digital logic circuitry 3. Therefore, the charge stores operate in charging cycles. The obscuring circuitry 6 may switch between different charge store activation patterns based on these charging cycles. In a simple example, the charge store activation pattern may switch for every charging cycle, for example a new selection of one or more of the plurality of capacitors 2 could be made every time the charge stores are charged. Alternatively, the charge store activation pattern may switch every M charging cycles, where M is a positive integer greater than one, or may change within a charging cycle. The charge store activation pattern may even switch based on charging cycles in a more complex manner such as every X charging cycles, where X is a value that changes over time. Alternatively, or as well, the obscuring circuitry 6 may switch between charge store activation patterns at intervals determined based on time. For example, a clock could dictate when the charge store activation pattern is to be switched. The charge store activation pattern could be switched at regular intervals of the clock, or in a more complex way such as switching at intervals that follow a predetermined pattern (e.g. switch after either 1 or 2 units of time on an alternating basis). Alternatively, or as well, the obscuring circuitry may switch between charge store activation patterns at intervals based on the start or completion of processing operations carried out by the digital logic circuitry 3. For example, when the digital logic circuitry 3 is cryptographic circuitry in a cryptographic unit 7 performing a cryptographic operation comprising several arithmetic operations, the obscuring circuitry 6 may switch between charge store activation patterns at the start of each arithmetic operation instead of, or in addition to, switching based on charging cycles and/or time. As such, it will be seen that there are many examples of switching that can be carried out by the obscuring circuitry 6 independent of the control of the processor 8.

The obscuring circuitry 6 may switch between charge store activation patterns in a random order. For example, the obscuring circuitry 6 may have access to a random number generator, used to make a random selection of capacitors 6. Selections of capacitors that do not meet the requirements of the current power setting may be discarded and a new selection made, such that each selection of capacitors meets the power setting. A pseudorandom non-predetermined selection of charge stores may be made in a similar manner, using a linear feedback shift register, for example.

However, in an embodiment, obscuring circuitry 6 switches between charge store activation patterns according to a predetermined pseudorandom sequence. This may allow the obscuring circuitry 6 to better obscure the switching activity of the digital logic circuitry 3.

Figure 6:
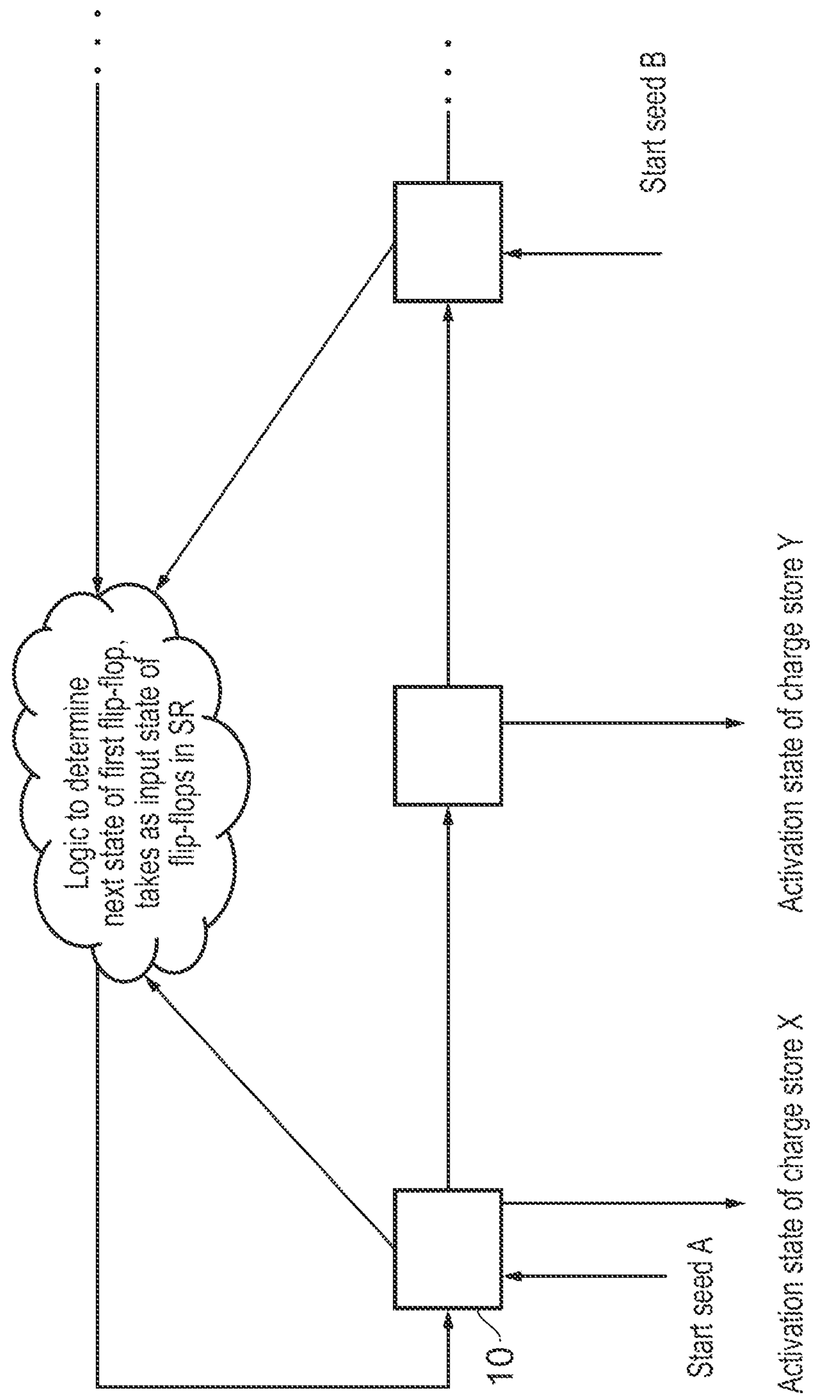
FIG. 6 illustrates a schematic diagram of a linear feedback shift register.

A particularly effective way to implement a pseudorandom sequence is through the use of a shift register. FIG. 6 shows a schematic diagram of a linear-feedback shift register, a particular type of shift register. The shift register comprises several flip-flops 10, which can each store a single bit of data. The flip-flops 10 are connected in sequence, so that the output of one flip-flop 10 is connected to the input of the next. Therefore, when a signal causes the shift register to increment, each flip-flop 10 outputs its stored value to the next sequential flip-flop 10, which takes the value as an input and stores the value. At this point, a new value can be input into the first flip-flop 10 in the sequence. Each state of the shift register may be associated with a given charge store activation pattern. For example, each flip-flop 10 could be used by obscuring circuitry 6 to determine whether a given capacitor 2 is included in a charge store activation pattern. There could be a one-to-one mapping between a flip-flop 10 and a capacitor 2 in a charge store activation pattern, such that one state of the flip-flop means that the capacitor 2 is not part of a charge store activation pattern, and another state means that the capacitor 2 is part of the charge store activation pattern. The shift register can be initialised by injecting values into one or more selected flip-flops corresponding to a start-point charge store activation pattern. FIG. 6 shows a linear-feedback shift register, in which the input bit for a given flip-flop is determined as a linear combination of the values of certain flip-flops in the previous state. The flip-flops that contribute to the input bit are called taps, and the value of the taps can be combined in any one of several ways. A simple example involves performing a XOR operation on the value of each tap. A linear feedback shift register such as that shown in FIG. 6 is capable of producing a sequence of values that is deterministic (a given initial state will always lead to the same state after Y iterations) but can have the appearance of being random.

This is just a simple example, and there are many ways that a shift register could be used to store a predetermined pseudorandom sequence of charge store activation patterns. For example, in another embodiment there could be a single "1" bit in a shift register where each flip-flop is associated with a charge store activation pattern, such that the charge store activation pattern at any time is the charge store activation pattern corresponding to the flip-flop that holds the "1" bit. Table 1, shown below, shows how a shift register may be used to control a sequence of charge store activation patterns.

TABLE 1

Shift register storing a sequence of charge store activation patterns

| Shift register state | Capacitor 0 | Capacitor 1 | Capacitor 2 | Capacitor 3 |
|---|---|---|---|---|
| 0 | X | X | | |
| 1 | | X | X | |
| 2 | | X | | X |
| 3 | | | X | X |
| 4 | X | X | | |

TABLE 1-continued

| Shift register storing a sequence of charge store activation patterns | | | | |
|---|---|---|---|---|
| Shift register state | Capacitor 0 | Capacitor 1 | Capacitor 2 | Capacitor 3 |
| 5 | X | | X | |
| 6 | X | | X | X |

The example of Table 1 has a power setting requiring that at least 50% of the capacitors are included in each charge store activation pattern. It will be seen that each state of the shift register is associated with a particular charge store activation pattern, however it will be appreciated that there is no requirement for each charge store activation pattern to be uniquely associated with a particular state. For example, shift register state 0 is associated with the same charge store activation pattern as state 4. In some embodiments, it may be required that states associated with the same charge store activation pattern are not next to each other (e.g. state 0 could not have the same charge store activation pattern as state 1). The shift register may step through the states sequentially starting from 0 and reaching 6, which could then loop back to 0. Each time the shift register takes a new state, obscuring circuitry 6 switches which capacitors 2 are providing power to the digital logic circuitry 3 to the capacitors 2 included in the new state.

There is no restriction that the first charge store activation pattern in the sequence is always associated with state 0, the sequence could start at any shift register state. For example, the initial state of the shift register could be chosen each time the sequence is started. A linear-feedback shift register could, for example, be used to select a start-point charge store activation pattern. One way this might be carried out is by seeding a certain number of bits into the shift register into locations determined by a linear-feedback shift register.

Figure 7:
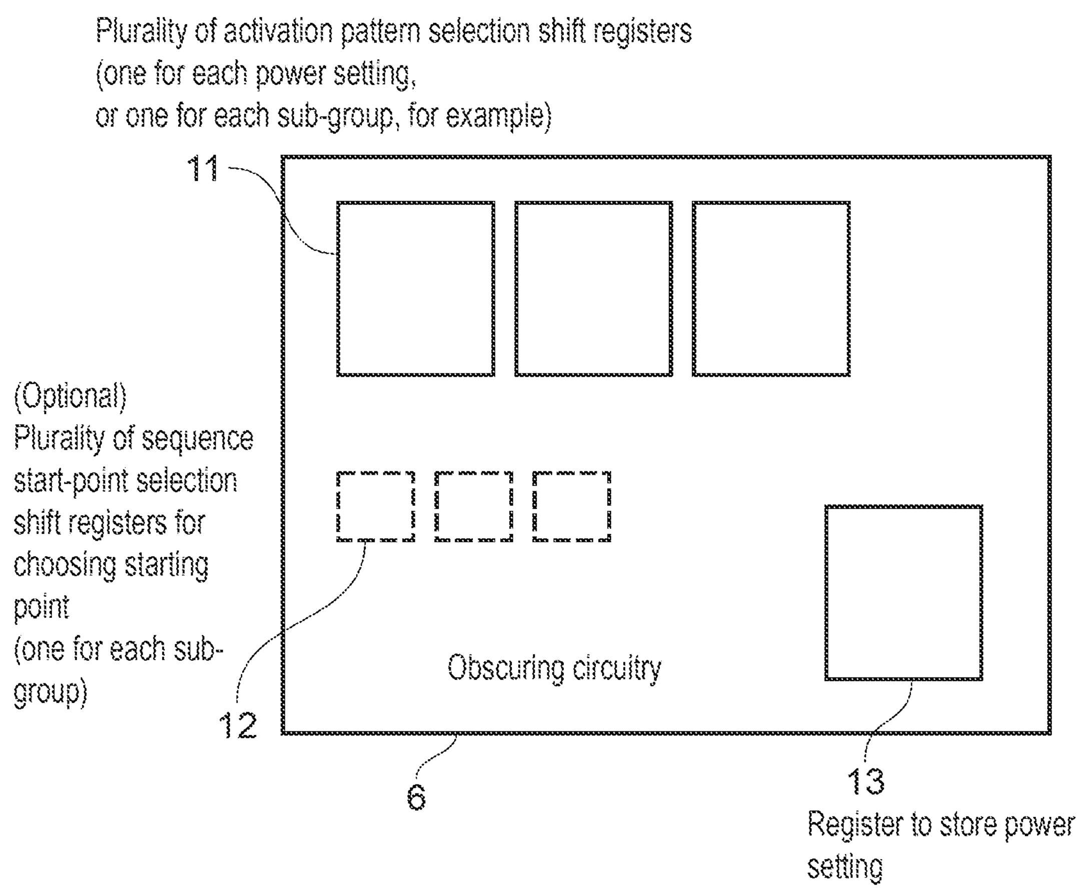
FIG. 7 illustrates a schematic diagram of obscuring circuitry for an integrated circuit.

FIG. 7 illustrates a schematic diagram of obscuring circuitry 6 for an integrated circuit. The obscuring circuitry 6 comprises a register 13 for storing a value indicative of the current power setting. The power setting may be expressed in many different ways—for example the power setting may be given as a minimum threshold power, as a minimum number of capacitors, or as a minimum proportion of the total available capacitors. The obscuring circuitry may also comprise several activation pattern selection shift registers 11. To implement the power setting, for example, each activation pattern selection shift register 11 may be associated with a different minimum power setting. That is, there may be a activation pattern selection shift register 11 used for a sequence of charge store activation patterns with a 50% threshold (as in Table 1), a second activation pattern selection shift register 11 with a 25% threshold and a third activation pattern selection shift register 11 with a 75% threshold. When the power setting is changed, a different activation pattern selection shift register 11 could be used by the obscuring circuitry to switch between charge store activation patterns. Different activation pattern selection shift registers 11 may also be used for separately controlling sequences of charge store activation patterns for different groups of capacitors 2 within the integrated circuit 1 at the same power setting. Separately controlling different groups of capacitors 2 adds a further layer of protection.

The obscuring circuitry of FIG. 7 also optionally comprises sequence start-point selection shift registers 12. These can be used to select the start-point charge store activation pattern for each shift register 11 when the sequence is started. A sequence may be started for many different reasons, such as when a new cryptographic operation is started, at predetermined time intervals, and in response to events in the processing system. While FIG. 7 shows multiple sequence start-point selection shift registers 12 for selecting the start point, this is not essential, and in other cases even if there are multiple activation pattern selection shift registers 11 for selecting the next charge store activation pattern for different power settings or sub-groups of charge stores, a shared sequence start-point selection shift register 12 could be used to select the start point of the sequence for each of registers 11. Instead of providing the sequence start-point shift registers 12, a random number generator could be used to select a start-point charge store activation pattern.

Figure 8:
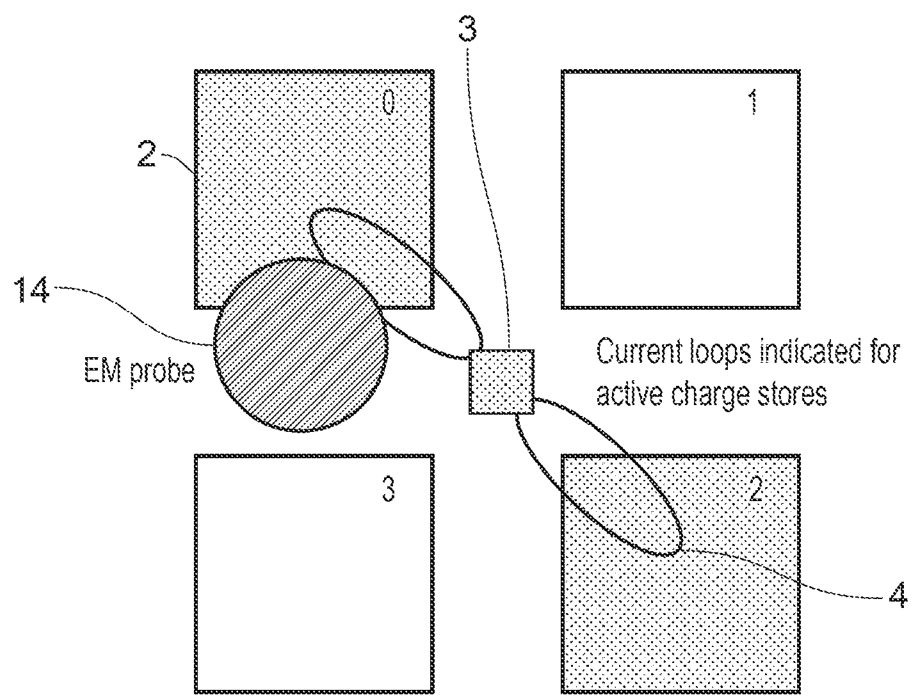
FIG. 8 illustrates a schematic diagram of an electromagnetic probe and an integrated circuit including charge stores.

FIG. 8 illustrates how the present technique can make an integrated circuit 1 more resistant to EM side channel attacks. In the example of FIG. 8, capacitors “0” and “2” provide power to the digital logic circuitry 3. It will be seen that this gives rise to current loops 4 between the active capacitors 2 and the digital logic circuitry 3. These current loops are indicated schematically. The actual path between capacitors 2 and digital logic circuitry 3 may be far more complex, but the oval current loops 4 indicated in FIG. 8 are used to provide a simple illustration. Current loops 4 generate a magnetic field according to Ampere’s law. This magnetic field may vary in strength with the variation in the power requirements of the digital logic circuitry, related to the activity of the digital logic circuitry. An EM probe 14 can be any device which generates a signal indicative of the electromagnetic field in which it is placed. A simple example is a coil of wire in which a varying external magnetic field will induce a current according to Faraday’s law. The strength of the current induced in the coil of wire will be related to both the rate of change of the magnetic field strength, the relative positions of the current loop and the coil, and the orientation of the coil with relation to the magnetic field (which all affect the rate of change of magnetic flux through the coil). Monitoring the current in such a coil can therefore give information about the magnetic field, which can in turn give information about the current in the current loop 4 and hence the activity of the digital logic circuitry 3.

If the charge store activation pattern were to change in the example of FIG. 8, the current loops would change. For example, if capacitors “1” and “2” were included in the next charge store activation pattern, the current loop between capacitor “0” and the digital logic circuitry 3 would be replaced by a loop between the capacitor “1” and the digital logic circuitry 3. If the EM probe were to remain in the same position, the same processing activity of the digital circuit logic 3 may cause a different reading in the EM probe than in the previous charge store activation pattern. As such, switching between charge store activation patterns can cause EM probe readings to change in a way unrelated to the activity of the digital logic circuitry, which can protect the system against EM side channel attacks.

Figure 9:
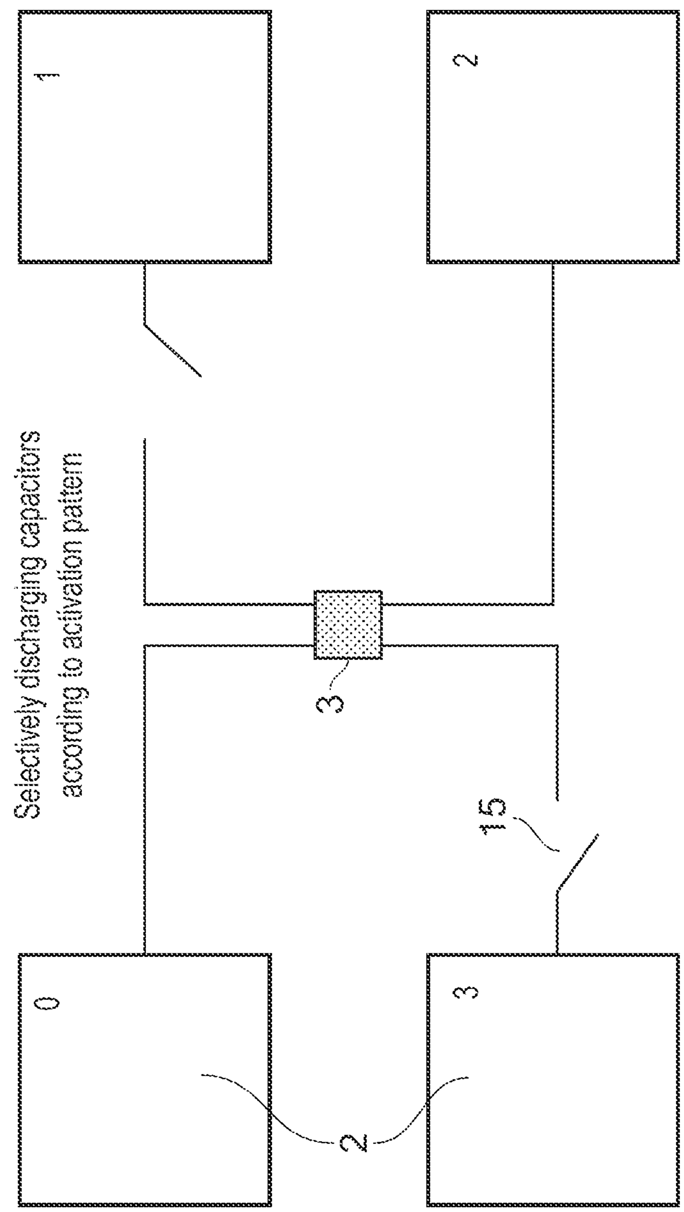
FIG. 9 illustrates a schematic diagram of an integrated circuit in which a selection of charge stores are providing power to circuitry.
Figure 10:
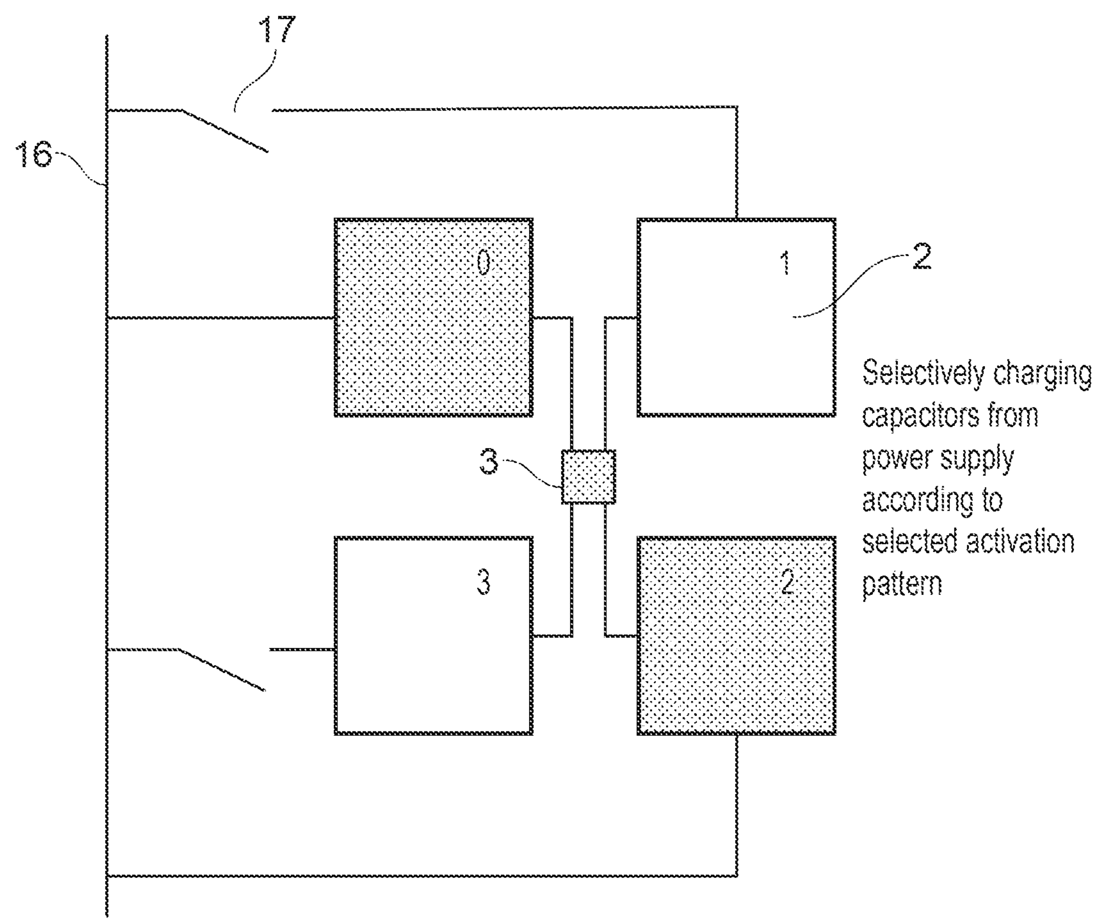
FIG. 10 illustrates a schematic diagram of an integrated circuit in which a selection of charge stores are receiving power from a power input.

FIG. 9 and FIG. 10 show two different ways that the obscuring circuitry 6 can be used to switch between charge store activation patterns.

In the example of FIG. 9, each capacitor 2 may be charged from a power input. In order to set a charge store activation pattern, the obscuring circuitry 6 may control switches 15 in the electrical connections between the capacitors 2 and the digital logic circuitry 3. For example, if the charge store activation pattern includes capacitors “0” and “2”, the switches 15 between capacitors “0” and “2” and the digital logic circuitry 3 may be set to conduct electrical current.

Likewise, the switches 15 between capacitors "1" and "3" and the digital logic circuitry 3 may be set such that they do not conduct electrical current. Therefore, current loops 4 will be formed only between the capacitors 2 included in the charge store activation pattern.

In the example of FIG. 10, each capacitor 2 may be permanently electrically connected to the digital logic circuitry 3. There may be switches 17 in the connections between the capacitors 2 and the power input 16. In this case, in order to set a charge store activation pattern the obscuring circuitry 6 may control the switches 17 to selectively charge the capacitors 2 that are included in the charge store activation pattern. For example, if the charge store activation pattern includes capacitors "0" and "2", the switches 17 between capacitors "0" and "2" and the power input 16 may be set to conduct electrical current. Likewise, the switches 17 between capacitors "1" and "3" and the power input 16 may be set such that they do not conduct electrical current. Therefore, although every capacitor 2 is connected to the digital logic circuitry 3, current loops 4 will be formed only between the capacitors 2 included in the charge store activation pattern, as these will be the only charged capacitors 2.

Figure 11:
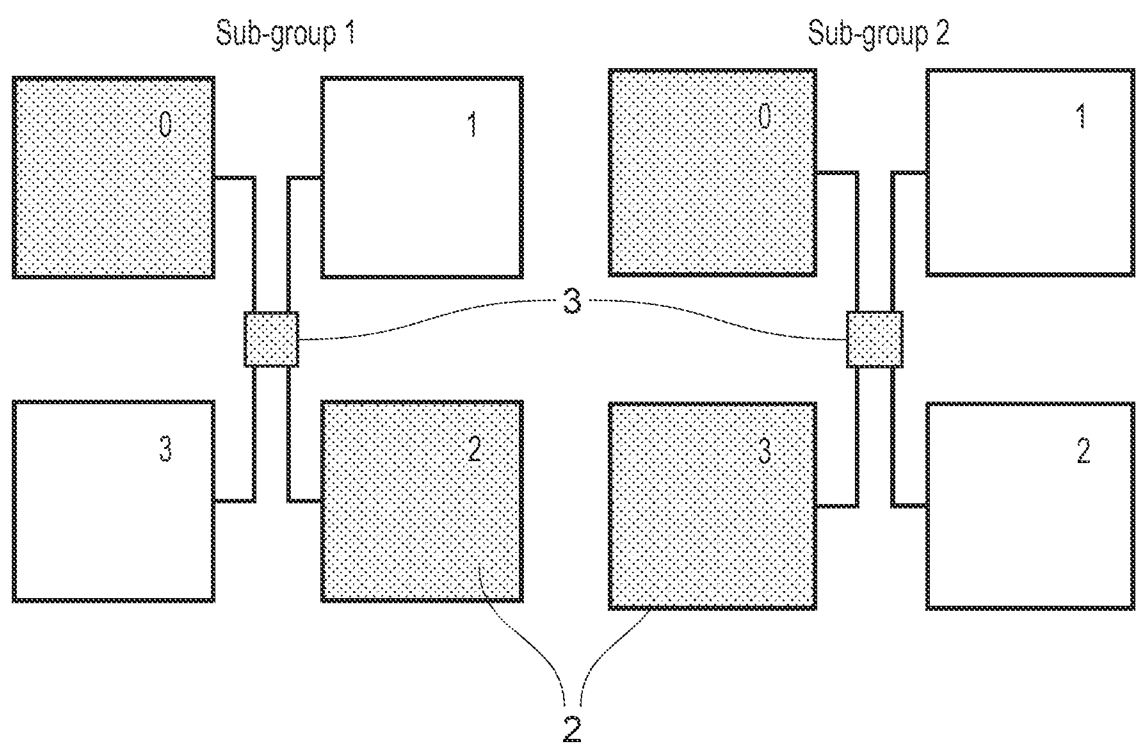
FIG. 11 illustrates a schematic diagram of an integrated circuit in which charge stores are divided into sub-groups.

FIG. 11 illustrates another view of the integrated circuit 1 of FIG. 3. In FIG. 11, eight capacitors 2 can be seen. The capacitors 2 may be divided into sub-groups, such that each sub-group of capacitors 2 provides power to a given region of digital logic circuitry 3 separate from the region of digital logic circuitry associated with any other sub-group. These sub-groups may be arbitrarily defined in terms of size and complexity. In the obscuring circuitry 6 of FIG. 7, shift registers 11 may be provided separately for each sub-group, such that each sub-group is controlled independently of other sub-groups in the integrated circuit 1. In some cases, a set of shift registers 11 comprising shift registers corresponding to different power settings may be associated with each sub-group. This may provide a further layer of protection. In addition, a linear-feedback shift register 12 may be separately provided for each sub-group, such that the predetermined pseudorandom sequence of charge store activation patterns can be started at a pseudorandom position each time it is started, separately for each sub-group, or alternatively a single shared LFSR 12 could select the start point for the shift registers 11 for each sub-group.

Figure 12:
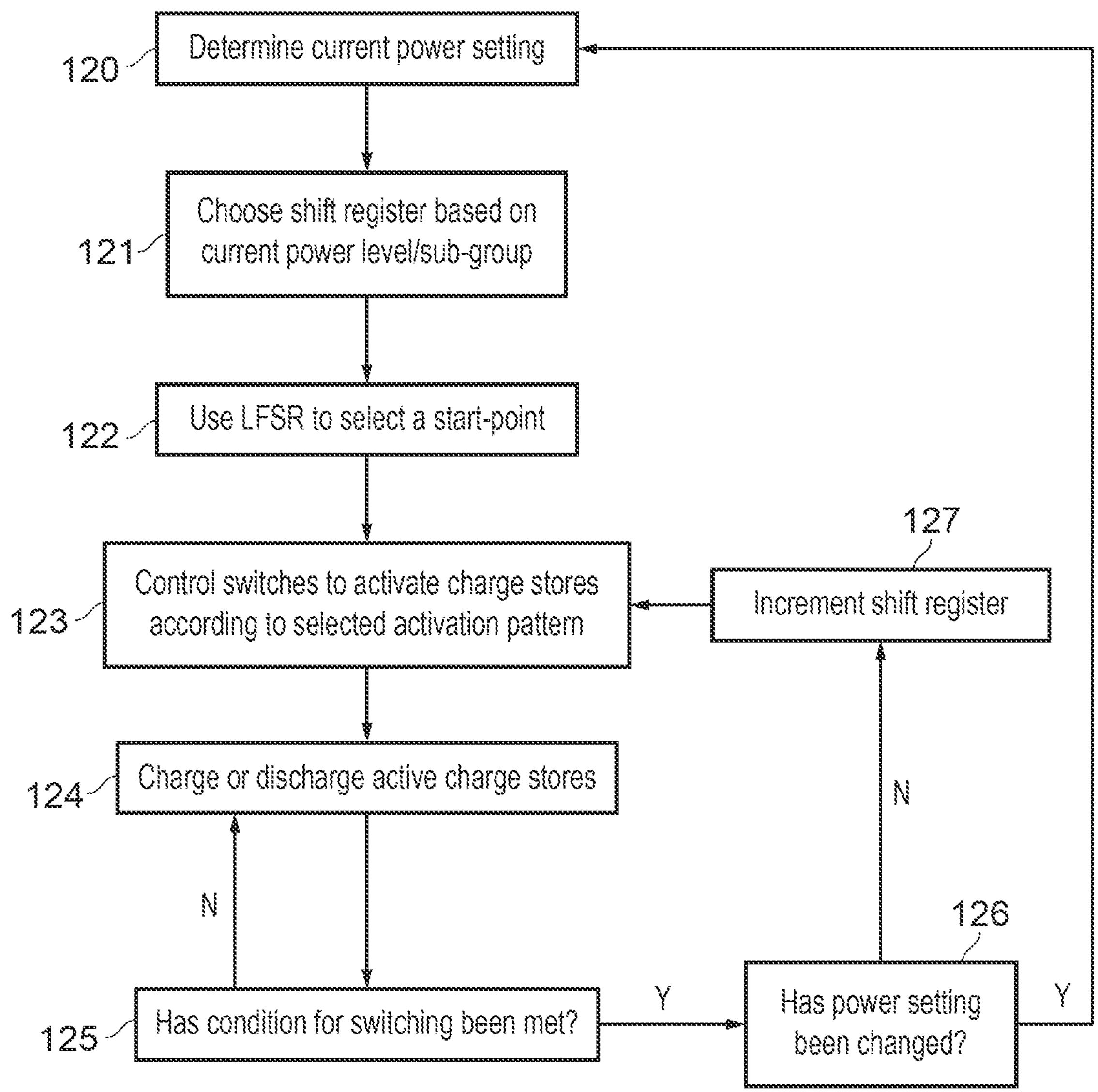
FIG. 12 illustrates a method of controlling an integrated circuit.

FIG. 12 illustrates a method of controlling an integrated circuit 1 using obscuring circuitry 6 according to a predetermined sequence. The method is carried out for a particular sub-group of capacitors 2 and begins at the start of a sequence. At step 120, a determination is made of the current power setting. For example, this may involve reading the value of the power setting register 13. At step 121 the obscuring circuitry selects an activation pattern selection shift register 11 to use to control switching, based on the current sub-group and the current power setting determined at step 120. At step 122, the obscuring circuitry 6 accesses a sequence start-point selection shift register 12 corresponding to the selected activation pattern selection shift register 11, and uses the sequence start-point selection shift register 12 to select an initial state of the activation pattern selection shift register 11 corresponding to a start-point charge store activation pattern. At step 123, the obscuring circuitry 6 controls switches 15, 17 to select capacitors 2 corresponding to the charge store activation pattern associated with the current state of the activation pattern selection shift register 11. At step 124, the selected charge stores are either charged (according to the example of FIG. 10) or discharged (according to the example of FIG. 9) according to the charge store activation pattern, and used to provide power to the digital logic circuitry 3. This step may involve several cycles of charging and discharging the selected capacitors 2. At step 125 a determination is made of whether a condition has been met to switch the current charge store activation pattern. For example, a counter or clock may be used to determine if a condition has been met, or obscuring circuitry may determine the state of a certain signal. If the condition for switching has not been met, the process continues at step 124 according to the charge store activation pattern selected at step 123. If the condition has been met, however, the charge store activation pattern is to be updated. Therefore, the process proceeds to step 126, where it is determined whether or not the power setting has been changed. If the power setting has been changed, the process returns to step 120 and a determination is made of the new power setting. If the power setting has not been changed, the same activation pattern selection shift register 11 may be used, and the process moves to step 127. At step 127 the shift register 11 is incremented and takes a new state, defining a new charge store activation pattern. The process then proceeds to step 123, where the obscuring circuitry 6 controls switches according to the new charge store activation pattern.

Figure 13:
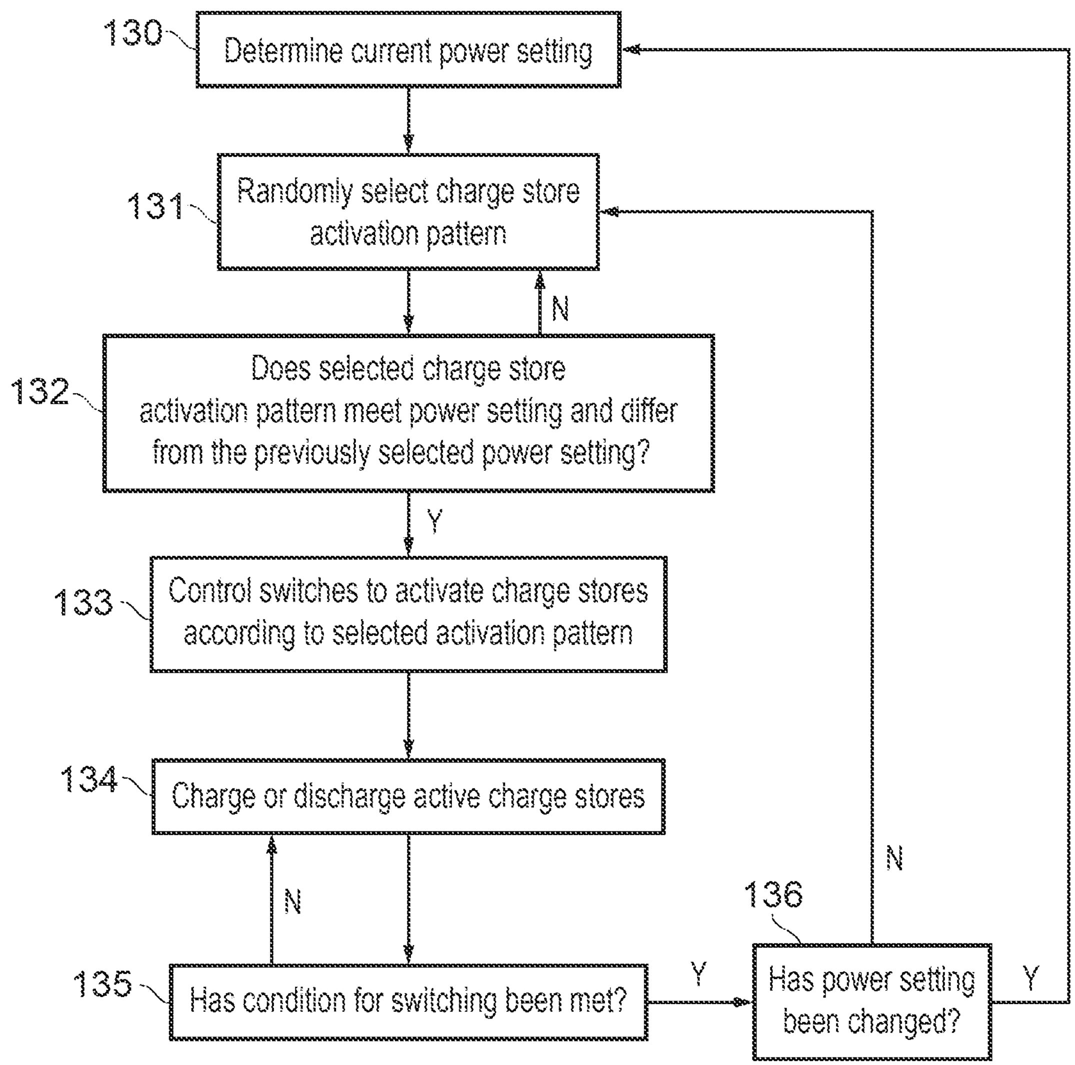
FIG. 13 illustrates a method of controlling an integrated circuit.

FIG. 13 illustrates a method of controlling an integrated circuit 1 using obscuring circuitry 6 according to a random sequence. At step 130, a determination is made of the current power setting as in step 120 of FIG. 12. At step 131, the obscuring circuitry selects a charge store activation pattern for a given sub-group of capacitors 2 randomly out of the set of all charge store activation patterns. At step 132 it is determined whether the selected charge store activation patterns meets the power setting determined in step 130 (in iterations of the loop except for the first iteration this step may also determine whether the selected charge store activation pattern is the same as the previously selected charge store activation pattern). If the power setting is not met or the selected pattern is the same as the previously selected pattern, the selected charge store activation pattern is discarded and the process returns to step 131. If the power setting is met and differs from the previously selected pattern, the process proceeds to step 133 where the obscuring circuitry 6 switches the charge stores to the selected charge store activation pattern. At step 134, the selected charge stores are either charged (according to the example of FIG. 10) or discharged (according to the example of FIG. 9) according to the charge store activation pattern, and used to provide power to the digital logic circuitry 3. This step may involve several cycles of charging and discharging the selected capacitors 2. At step 135 a determination is made of whether a condition has been met to switch the current charge store activation pattern. For example, a counter or clock may be used to determine if a condition has been met, or obscuring circuitry may determine the state of a certain signal. If the condition for switching has not been met, the process continues at step 134 according to the charge store activation pattern selected at step 133. If the condition has been met, however, the charge store activation pattern is to be updated. Therefore, the process proceeds to step 136, where it is determined whether or not the power setting has been changed. If the power setting has been changed, the process returns to step 130 and a determination is made of the new power setting. If the power setting has not been changed, the process proceeds to step 131 where a new charge store activation pattern is randomly selected.

As illustrated in FIGS. 12 and 13, the obscuring circuitry 6 can switch between a plurality of different charge store activation patterns to obscure the electromagnetic emissions associated with the current loops 4 formed between the capacitors 2 and the digital logic circuitry 3.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope of the invention as defined by the appended claims.

The invention claimed is:

1. An integrated circuit comprising:

a power input;

digital logic circuitry;

a plurality of charge stores, configured to receive power from the power input and capable of providing power to the digital logic circuitry;

wherein the plurality of charge stores are distributed through the digital logic circuitry; and obscuring circuitry configured to obscure electromagnetic emissions associated with flow of current in current loops between the plurality of charge stores and the digital logic circuitry by switching between a plurality of different charge store activation patterns, wherein:

each charge store activation pattern describes a different selection of one or more of the plurality of charge stores providing power to the digital logic circuitry at a given time.

2. An integrated circuit according to claim 1, wherein:

the obscuring circuitry is configured to switch between the plurality of different charge store activation patterns according to a predetermined or random sequence.

3. An integrated circuit according to claim 2, wherein:

the obscuring circuitry is configured to switch between the plurality of different charge store activation patterns according to the predetermined or random sequence starting at a start-point charge store activation pattern, wherein when starting the predetermined or random sequence, the obscuring circuitry is configured to randomly or pseudorandomly select the start-point charge store activation pattern.

4. An integrated circuit according to claim 2, wherein:

the sequence is a predetermined sequence comprising charge store activation patterns arranged in a pseudo-random order.

5. An integrated circuit according to claim 2, wherein either:

the predetermined or random sequence is a predetermined sequence and neighbouring charge store activation patterns in the predetermined sequence are different to each other, or the predetermined or random sequence is a random sequence and, when switching to a next charge store activation pattern from a previously selected charge store activation pattern, the obscuring circuitry is configured to prevent the next charge store activation pattern from being the same as the previously selected charge store activation pattern.

6. An integrated circuit according to claim 2, wherein:

the obscuring circuitry comprises a shift register; and each charge store activation pattern in the sequence is associated with a state of the shift register.

7. An integrated circuit according to claim 1, wherein:

at least one charge store in the plurality of charge stores is a capacitor.

8. An integrated circuit according to claim 1, wherein:

each charge store activation pattern in the plurality of different charge store activation patterns describes a selection of one or more charge stores with a combined charge capacity greater than a threshold amount.

9. An integrated circuit according to claim 8, wherein:

the threshold amount is a configurable parameter of the obscuring circuitry.

10. An integrated circuit according to claim 1, wherein:

the obscuring circuitry is configured to set a given charge store activation pattern by controlling charging, from the power input, of one or more of the plurality of charge stores selected according to the given charge store activation pattern.

11. An integrated circuit according to claim 1, wherein:

the obscuring circuitry is configured to set a given charge store activation pattern by controlling discharging, to the digital logic circuitry, of one or more of the plurality of charge stores selected according to the given charge store activation pattern.

12. An integrated circuit according to claim 1, wherein:

different charge store activation patterns, delivering the same amount of power to the digital logic circuitry, cause different readings to be detected by an electromagnetic probe at a fixed position relative to the integrated circuit.

13. An integrated circuit according to claim 1, wherein:

the obscuring circuitry is configured to switch between the plurality of different charge store activation patterns at intervals determined on the basis of any of:

charging cycles, wherein a charging cycle is a period during which power is provided from the power input to the charge stores and subsequently provided from the charge stores to the digital logic circuitry;

time; and start or completion of at least one processing operation carried out by the digital logic circuitry.

14. An integrated circuit according to claim 1, wherein:

the obscuring circuitry is capable of triggering a switch between the plurality of different charge store activation patterns at a timing independent of at least one of:

whether software has requested a change of charge store activation pattern or a change of an amount of power provided to the digital logic circuitry; and whether power control circuitry for controlling an amount of power provided to the digital logic circuitry has requested a change in the amount of power.

15. An integrated circuit according to claim 1, wherein:

two or more of the plurality of different charge store activation patterns include a selection of charge stores with the same combined charge capacity.

16. An integrated circuit according to claim 1, wherein:

the charge stores in the plurality of charge stores are distributed through the digital logic circuitry in a tiled arrangement.

17. An integrated circuit according to claim 1, wherein:

the plurality of charge stores comprises a plurality of sub-groups of charge stores, wherein the obscuring circuitry is configured to separately control switching between charge store activation patterns for different sub-groups of charge stores.

18. An integrated circuit according to claim 17, wherein the obscuring circuitry is configured to separately control the switching between the charge store activation patterns for the different sub-groups of charge stores by performing at least one of:

switching between the charge store activation patterns for at least two of the plurality of sub-groups of charge stores according to different predetermined or random sequences;

switching between charge store activation patterns at different timings for at least two of the plurality of sub-groups of charge stores; and selecting different start-point charge store activation patterns for at two of the plurality of sub-groups of charge stores.

19. A method for an integrated circuit, comprising:

charging, using a power input, a plurality of charge stores capable of providing power to digital logic circuitry;

wherein the plurality of charge stores are distributed through the digital logic circuitry; and obscuring electromagnetic emissions associated with the flow of current in current loops between the plurality of charge stores and the digital logic circuitry by switching between a plurality of different charge store activation patterns, wherein each charge store activation pattern describes a different selection of one or more of the plurality of charge stores providing power to the digital logic circuitry at a given time.

* * * * *